(12) United States Patent  
Pan et al.

(10) Patent No.: US 6,541,749 B1  
(45) Date of Patent: Apr. 1, 2003

(54) PHOTODETECTOR PIXEL CELL

(75) Inventors: Jui-Hsiang Pan, Hsin-Chu; Pei-Yu Chiang, Ta-Li, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/430,270

(22) Filed: Oct. 29, 1999

(51) Int. Cl.$^7$ .............................................. H01L 47/00
(52) U.S. Cl. ............................ 250/208.1; 250/214.1; 257/233
(58) Field of Search ..................... 250/208.1, 214 R; 257/233, 292, 369

(56) References Cited

U.S. PATENT DOCUMENTS 5,625,210 A * 4/1997 Lee et al. .................... 257/292  
5,691,548 A * 11/1997 Akio .......................... 257/232

\* cited by examiner

Primary Examiner—Seungsook Ham  
Assistant Examiner—Bradford Hill

(74) Attorney, Agent, or Firm—Powell Goldstein Frazer & Murphy LLP

(57) ABSTRACT

A photodetector pixel cell is proposed by the invention. Herein, the presented pixel cell comprises a diode region and a circuit region, and is enclosed by isolation. Moreover, the doped region is existed inside both regions. The structure of the presented pixel cell comprises following characteristics: First, the first well is only located inside the circuit region, where the conductive type of the first well is opposite to the conductive type of the doped region. Second, the second well is located inside the diode region and is contiguous to the isolation, where the conductive type of the second well is equal to that of the doped region. Third, the doped region is not contiguous to the second well, they are separated by uncovered surface part of the substrate. Fourth, the doped region and the substrate provide the diode. Therefore, not only both the light sensitivity is increased and the RC delay time is decreased for both the scale of the PN-junction is increased and the width of the depletion region is increased, but also the damage induced leakage current is properly prevented for the edge of isolation is surrounded second well inside the diode region.

10 Claims, 4 Drawing Sheets

PHOTODETECTOR PIXEL CELL

BACKGROUND OF THE INVENTION

1. Field of the Invention

The present invention is related to the field of photodetector and more particularly to a pixel cell with high light sensitivity and low delay time, wherein the photons are detected by a diode of the pixel cell.

2. Description of the Prior Art

Because the photons of incident light can be translated into the electron-hole pairs and the quantity of the induced current is proportional to the quantity of the absorbed photons. The semiconductor devices are broadly used to form the photodetector, especially are used to form the sensors of the photodetector.

Though there are many varieties of sensors, such as the high complementary metal-oxide semiconductor sensor (CMOS sensor) that within high integration and low energy dissipation, the structure of most of the conventional pixel cells can be divided into a circuit region and a diode region. Herein, the diode region is consist of a diode that is activated by the incident light, and the circuit region is consist of some devise that are linked to the diode and are used to process the signals induced by the induced current.

The conventional structure of the pixel cell is illustrated in FIG. 1 and explained in following discussions. Herein, the top-view figure of a CMOS sensor is shown.

As FIG. 1 shows, isolation 10 not only locates on the boundary of the pixel cell and encompasses it, but also briefly divides the pixel cell into a circuit region and a diode region. Herein, some devices such as gate 11 and conductive line 12 are located inside the circuit region and are used to process so-called induced current from the diode region. Beside, the pixel cell is formed on a substrate within a well, where the conductive type of the substrate is equal to the conductive type of the well. Further, doped regions 14 are formed in the substrate and are contiguous to the surface of substrate, and the conductive type of doped regions 14 is opposite to the conductive type of the well. Moreover, doped regions 14 are used to provide sources and drains of devices (gates 11 and conductive line 12) in the circuit region, and are used to provide the required diode in the diode region. Conductive structure 13 is used to connect one gate 11, which located inside the circuit region, and one conductive line 12, which located inside the diode region and contacted with doped region 14. As usual, in order to increase the protective area to enhance sensitivity of the pixel cell, doped regions 14 cover almost total surface of the substrate.

The conventional structure and mechanism of the pixel cell are further explained in following discussion with FIG. 2, where a qualitative cross-section illustration along the AA' line is presented.

As FIG. 2 shows, when light is projected into the pixel cell, light is only projected in the diode region. Clearly, a diode is formed by doped region 14 and well 15, and then depletion region 16 is formed to absorb photons of incident light. Of course, in order to prevent depletion region 16 of a pixel cell interferes with other pixel cells, channel stopper 17 could be formed under isolation 10. Herein, isolation 10 can be the field oxide or the shallow junction. Moreover, FIG. 2 illustrates the case that three gates 11 and three conductive lines 12 are used, these gates 11 and conductive lines 12 are corresponding to reset terminal, raw select terminal and source follower terminal respectively.

Significantly, owing to that fact that doped regions 14 are usually produced at the same time and are used to form both diode and sources/drains, density and depth of doped regions 14 must balance requirements of both sources/drains and diode. Thus, the diode is not optimized to let the absorbing efficiency of depletion region 16 be maximized.

No matter how, even doped regions 14 and other regions are separately formed to maximize the absorbing efficiency of depletion region 16. Some defects of the previous pixel cell still are happened. First, because depletion region 16 is located under doped regions 14 and the penetrating depths of different wavelength lights are different, it is hard to form a pixel cell that is efficiently for different color lights simultaneously. For example, when the depth of doped regions 16 is larger than the penetrating depth of a specific light, the pixel cell is not efficient to detect the specific light. Second, because the narrow width of depletion region 16 will induce larger capacitance, resistance-capacitance (RC) delay time of the pixel cell is large and then the response of the pixel cell, such as reset time and readout time, would be prolonged. Third, the corner of isolation 10 is neighboring to the PN junction of the light induced diode, and then any damage of isolation 10 will induce leakage, i.e. dark current, especially when isolation 10 is a field oxide with high stress.

According to these discussions, it is crystal-clear that the conventional structure of pixel cell is not perfect and some defects are serious and unavoidable. Thus, it is desired to develop a new pix cell structure that efficiently overcomes these previous defects.

SUMMARY OF THE INVENTION

One primary object of the present invention is to propose a photodetector pixel cell with high absorbing efficiency.

Another object of the present invention is to propose a photodetector pixel cell with high light sensitevity and low RC delay time.

A further object of the present invention is to propose a photodetector pixel cell without negligible leakage current.

Moreover, a specific object is to propose a manufacturable photodetector pixel cell with the photodiode.

In order to accomplish these objects of the invention, a photodetector pixel cell with the photodiode is presented as an embodiment of the invention.

The presented pixel cell is enclosed by the isolation and comprises a diode region and a circuit region. Herein, the circuit region and the doped region also are briefly separated by the isolation. Moreover, the presented pixel cell is formed in and on a substrate, and the doped regions are located inside both the circuit region and the diode region. Further the conductive type of doped regions is opposite to the conductive type of the substrate.

Additional, the presented pixel cell at least comprises following characteristics: First, a well is only located in the circuit region, where the conductive type of the well is equal to the conductive type of the substrate. Second, a well is located inside the diode region and is contiguous to the isolation, where the conductive type of the well is equal to that of the doped region. Third, the doped regions are not contiguous to the second well. Fourth, the diode is provided by the doped region and the substrate.

According to previous characteristics, the scale of the PN-junction is increased and the width of the depletion region also is increased, and then the light sensitivity is increased and the RC delay time is decreased. Moreover, because the edge of the isolation is surrounded by the second well inside the diode region, the damage induced leakage current is properly prevented.

BRIEF DESCRIPTION OF THE DRAWINGS

Other objectives, features, and advantages of the present invention will become apparent from the following detailed description. The description is made with reference to the accompanying drawing, in which.

DESCRIPTION OF THE PREFERRED EMBODIMENT

The presented embodiment is a photodetector pixel cell. The presented pixel cell also comprises a circuit region and a diode region. Moreover, the main differences between the embodiment and well-known structure are focused inside the diode region.

The presented embodiment is a photodetector pixel cell with the photodiode. As well as conventional pixel cell, the presented pixel cell also comprises a circuit region and a diode region. Moreover, the main differences between the embodiment and well-known structure are focused inside the diode region.

Figure 3:
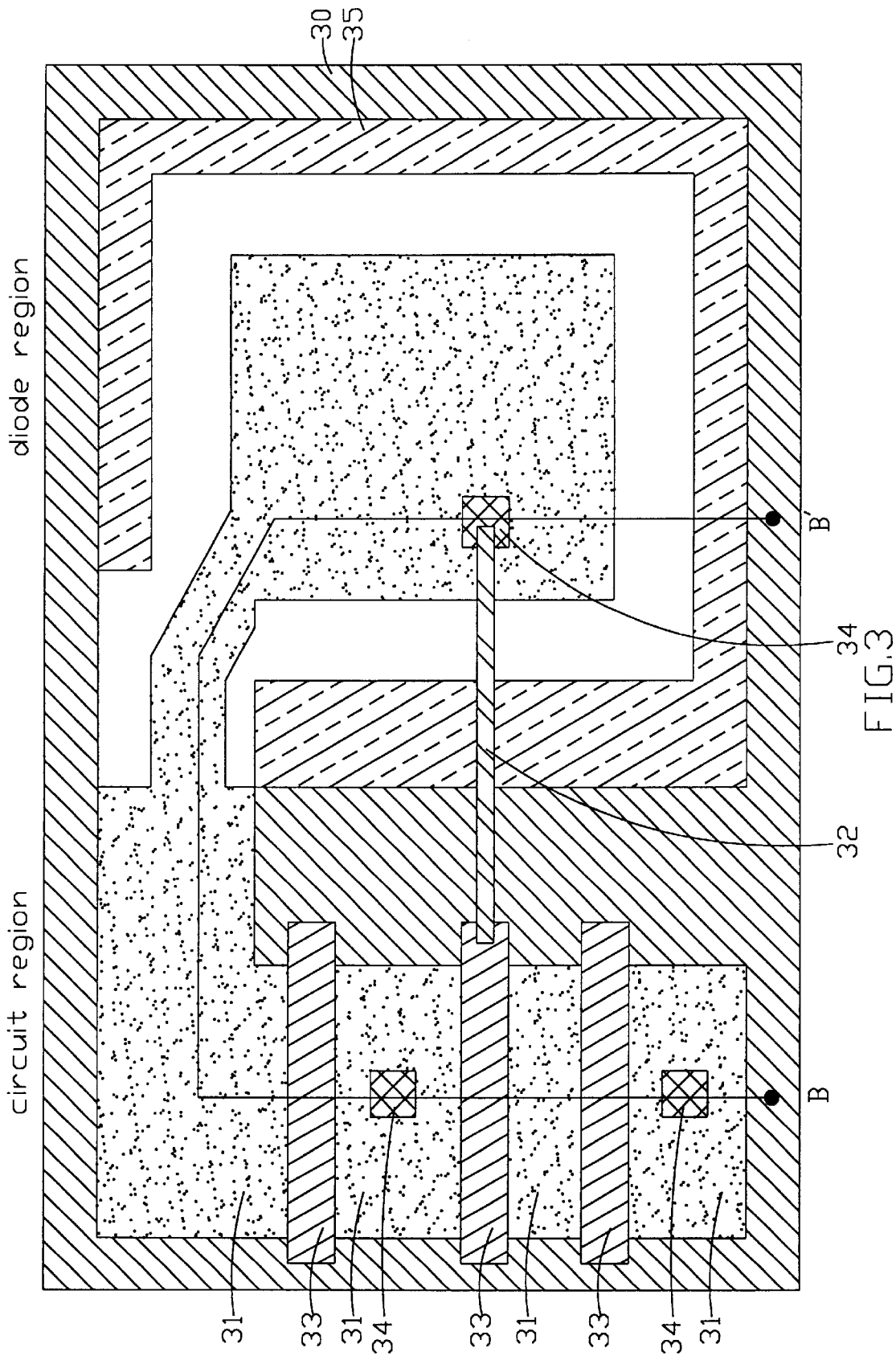
FIG. 3 is a qualitative top-view about structure of a photodetector pixel cell with the photodiode that is presented as an embodiment of the invention.
Figure 4:
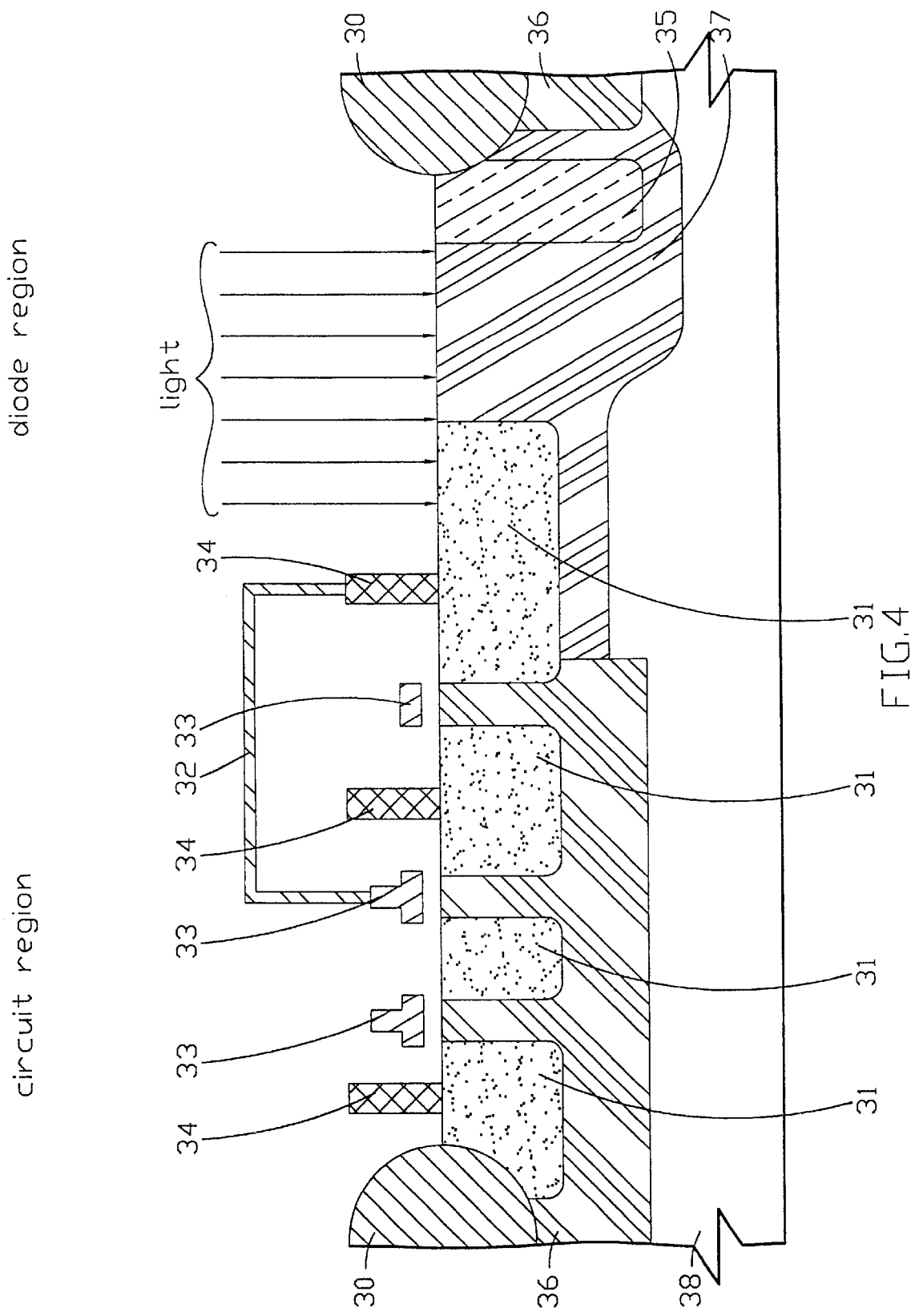
FIG. 4 is a qualitative cross-sectional illustration about structure and mechanism of the presented photodetector pixel cell with the photodiode.

As shown in FIG. 3, also referring to FIG. 4, the presented photodetector pixel cell comprises isolation 30, first well 35, second well 36, some devices, some doped regions 31, and conductive structure 32. Of course, the presented pixel cell is formed in and on substrate 38. Herein, the conductive type of substrate 38 is equal to the conductive type of second well 36, the conductive type of first well 35 is equal to the conductive type of the doped regions, but the conductive type of first well 35 is opposite to the conductive type of second well 36. Of course, the conductive type of doped region can be either electropositivity or electronegativity. Anyway, owing to the fact that the mobility of electron is larger than that of hole, it is better to form the presented pixel cell by N-type doped region.

In the presented pixel cell, isolation 30 is located on substrate 38 and is partially inside substrate 38. Further, as FIG. 3 shows, isolation 30 not only is located around the inner boundary of the presented photodetector pixel cell but also is extended into the presented pixel cell. Hereto, the presented pixel cell not only is encompassed by isolation but also is briefly divided into a diode region and a circuit region, whereby an incident light only can propagate into the diode region but can not propagate into the circuit region. Certainly, isolation 30 is used to protect the operation of the presented pixel cell from any external interference, especially the interference from the neighboring pixel cells. Moreover, isolation 30 can be field oxide or shallow junction.

Though not directly shown in FIG. 3, both first well 35 and second well 36 are located in substrate 38 and abutted surface of substrate 38, where second well 36 also can be located under isolation 30 and is used to isolate any pixel cell from the neighboring pixel cells.

Furthermore, first well 35 is located around the inner boundary of the diode region and is contiguous to isolation 30. Thus, the edge of isolation 30 is enveloped by first well 35. No matter how, it should be noted that first well 35 do not suffuse the diode region.

In comparison, some devices, such as the metal oxide semiconductor transistors, are located inside the circuit region. Herein, these devices, such as gates 33 and conductive lines 34, are in and on substrate 38. Beside, second well 36 almost suffuse the circuit region except is right under gates 33.

Further, some doped regions 31 are located in substrate 38 and are abutted surface of substrate 38. In addition, in the circuit region, doped regions 31 also are formed in the second well 36 and are abutted surface of the second well 36. Thus, owing to FIG. 3 is a top-view illustration and the surface of second well 36 is covered by both doped regions 31 and these devices, the second well 36 is not directly shown in FIG. 3.

Moreover, in the circuit region, these doped regions 31 are used to form the sources and the drains of the related devices. And in the diode region, doped region 31 is used to form one end of the required diode and is essentially not contiguous to first well 35. Moreover, doped density of any doped region 31 usually is less than doped density of first well 35, especially for the doped region 31 that is inside the diode region.

Beside, conductive structure 32 is used to conduit current from the diode region into these devices, and available material of conductive structure 32 comprises metal. Further, one end of conductive structure 32 is located inside the diode region and is connected with doped region 31 by at least one conductive line, and another end of conductive structure 32 is located inside the circuit region and is connected with these devices. Surely, to avoid any unexpected short, other part of conductive structure 32 usually is located over substrate 38, otherwise an insulating equipment would be required.

Furthermore, the structure of the presented pixel cell can be summarized as the follows.

First, isolation 30 locates on the boundary of pixel cell and is extended inside the pixel cell, therefore, the presented pixel cell not only is encompassed by isolation 30 but also is briefly divided into a circuit region and a diode region by isolation 30.

Second, second well 36 and several doped regions 31 are formed inside the circuit region, the herein conductive type of the second well 36 is equal to that of substrate 38 but is opposite to that of doped regions 31. Beside, some devices, such as gates 33 and conductive lines 34, are formed on the circuit region.

Third, in the diode region, there is no second well 36 but there is first well 35 that is located around the inner boundary of the diode region. Herein, first well 35 is contiguous to isolation 30 to let the edge of isolation 30 be enveloped by first well 35. No matter how, both first well 35 and doped regions 31 are located inside the diode region, but the first well 35 does not contact with doped region. Further, any electron-hole pair induced by light inside the diode region is conducted to the devices by both conductive structure 32 and a conductive line inside the doped regions 31 of the diode region.

The structure of the presented pixel cell can be further introduced by referring to FIG. 4, where a qualitative cross-section illustration along the BB' line is presented. Moreover, in FIG. 4, the illustrated case is that light is projected into the diode region of the pixel cell.

Clearly, a diode is formed by doped region 31 and substrate 38, and corresponding depletion region 37 is formed where photons of incident light are absorbed. Obviously, owing to doped region 34 not totally covers the diode region, the width of depletion region 37 is larger. Beside, location of depletion region 37 is not always under doped region 34, which is a serious defect of the conventional pixel cell.

Figure 1:
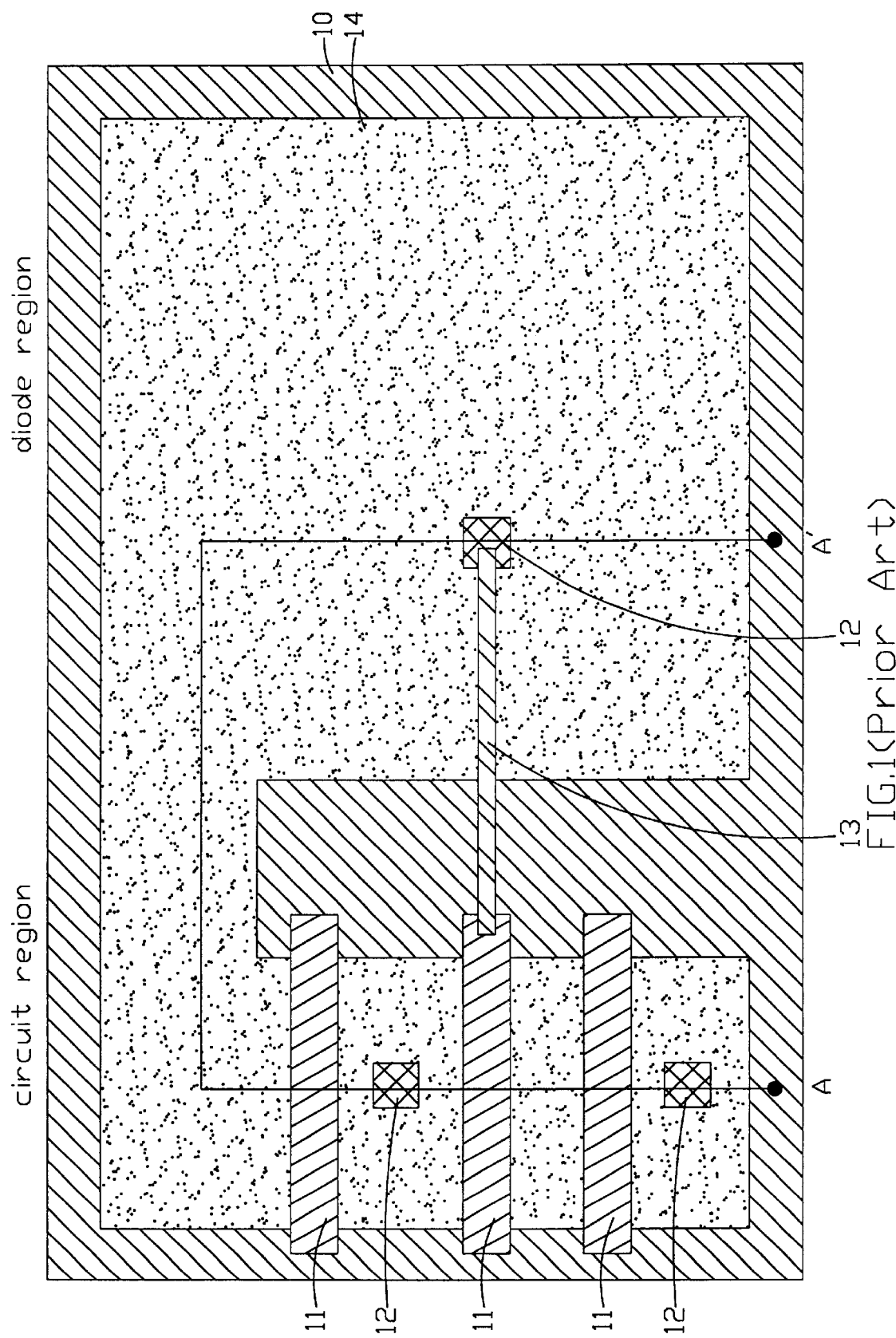
FIG. 1 is a qualitative top-view illustration about structure of conventional photodetector pixel cell with the photodiode.
Figure 2:
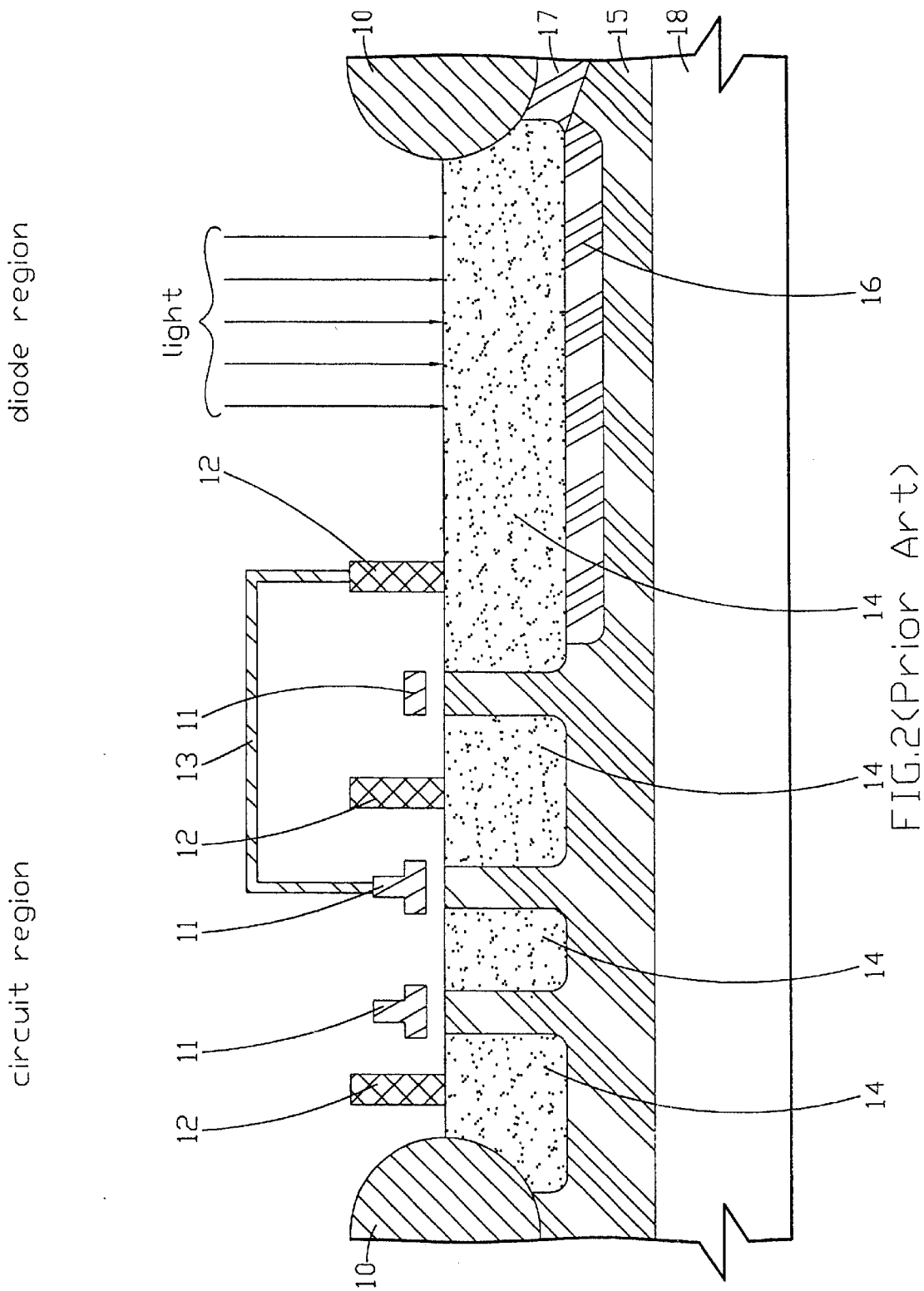
FIG. 2 is a qualitative cross-sectional illustration about structure and mechanism of conventional photodetector pixel cell with the photodiode.

Obviously, the distribution of depletion region 37 is one main excellence of the invention. By comparing FIG. 2 with FIG. 4, it is clear that cell depletion region 16 is located between doped regions 14 and well 15 in conventional pixel, but depletion region 37 is located between doped regions 34 and substrate 37 in the invention. Therefore, because doped regions 34 do not cover total surface of substrate 38 inside the diode region, the distribution of depletion region 37 is broader than conventional pixel cell. Further, even the horizontal distribution is not obviously increased, the vertical distribution of depletion region 37 is significant increased. In the invention, depletion region 37 is distributed from surface of substrate 38 to interiority of substrate 38.

Therefore, because the penetrating depths of different color lights are different, for example the penetrating depth of red light is about 2 microns and the penetrating depth of blue light is about 0.2 micron, it is significant that the proposed pixel cell can be efficiently for different color lights simultaneously. For example, when depth of both doped regions 34 is deeper enough to let bottom of depletion region 37 is deeper than 2 microns, the presented pixel cell can efficiently absorb any visible light. To compare with conventional structure of pixel cell that only light with penetrating depth between depth of doped regions 14 and depth of well 15 can be efficiently absorbed, advantage of the invention is significant for the present pixel unit can be applied for different color light without modulating depth of doped regions 34 that will affect performance of devices inside the circuit region. Moreover, same pixel unit can be used for detector of different light by only changing the color filter that is formed on the pixel cell.

Furthermore, because the width of depletion region 37 is increased and the capacitance is inversely proportion to the width, the RC delay time of the pixel cell is significantly decreased. Thus, not only the light sensitivity of the present pixel cell is increased by larger width of depletion region 37, but also the response of the present pixel unit is more rapid than the conventional pixel cell.

Beside, because first well 35 surround the edge of isolation 30, depletion region 37 does not directly contact with the edge of isolation. Therefore, the function of the depletion region is not interfered by isolation 30, and then damages of isolation 30 will not induce any leakage current that will be mixed into the normal current of depletion region 37 and induce unavoidable noise.

Further, the difference between the invention and the conventional pixel cell is concentrated on the diode region, and the main alterations only are zoom in of doped regions 34 and insertion of first well 35. It is obvious that fabrication of the proposed photodetector pixel cell is not difficult and is manufacturable.

In additional, in order to form a complete photodetector pixel cell, the proposed invention further comprising forming some extra structures on substrate 38. So-called extra structures comprise the dielectric layer, the passivation layer, the color filter layer and the microlens. Herein, these extra structures are formed in sequence.

While the present invention has been particularly shown and described with reference to the preferred embodiment thereof, it will be understood by those skilled in the art that various changes in form and details may be made without departing from the spirit and scope of the invention.

What is claimed is:

1. A photodetector pixel cell with the photodiode, where said photodetector pixel cell is formed in and on a substrate, said photodetector pixel cell comprising:

an isolation, wherein said isolation is located on said substrate and partially inside said substrate, said isolation not only being located around the inner boundary of said photodetector pixel cell and compassing said photodetector pixel cell, but also briefly dividing said pixel cell into a diode region and a circuit region;

a first well, wherein said first well is located in said substrate and is abutted the surface of said substrate, said first well being located around the inner boundary of said diode region and being contiguous to said isolation to let the edge of said isolation be enveloped by said first well, wherein the conductive type of said first well is opposite to the conductive type of said substrate;

a second well, wherein said second well is located in said substrate and is abutted the surface of said substrate, said second well being located inside said circuit region, wherein the conductive type of said second well is opposite to the conductive type of said first well;

a plurality of devices, wherein said devices are located in said circuit region and are located in and on said substrate;

a plurality of doped regions, wherein said doped regions are located in said substrate and are abutted the surface of said substrate, said doped regions being used to form both the source and the drain of said devices, said doped regions also being located inside said diode region but being not contiguous to said first well, wherein the conductive type of any said doped regions is opposite to the conductive type of said second well; and a conductive structure, wherein the first end of said conductive structure is located inside said diode region and is connected with at least one of said doped regions, the second end of said conductive structure being inside said circuit region and is connected with said devices.

2. The pixel cell according to claim 1, wherein the conductive type of said substrate is electropositivity.

3. The pixel cell according to claim 1, wherein the conductive type of said substrate is electronegativity.

4. The pixel cell according to claim 1, wherein said isolation comprises field oxide.

5. The pixel cell according to claim 1, wherein said isolation comprises shallow junction.

6. The pixel cell according to claim 1, wherein the doped density of any said doped region is less than the doped density of said first well.

7. The pixel cell according to claim 1, wherein an incident light only can propagate into said diode region, but said incident light can not propagate into said circuit region.

8. The pixel cell according to claim 1, wherein the material of said conductive structure comprises metal.

9. The pixel cell according to claim 1, wherein said circuits comprise metal oxide semiconductor transistor.

10. The pixel cell according to claim 1, wherein said second well is located under said isolation.

* * * * *